(12) United States Patent
Zhang et al.

(10) Patent No.: US 9,578,795 B2
(45) Date of Patent: Feb. 21, 2017

(54) SYSTEM AND METHOD FOR EXTRACTING COMPONENTS

(71) Applicant: LTG Green-Tech R&D Company Limited, Road Town (VG)

(72) Inventors: Lei Zhang, Xianyang (CN); Ming-Tong Wang, New Territories (HK)

(73) Assignee: Li Tong (H.K.) Telecom Company Limited (HK)

( * ) Notice: Subject to any disclaimer, the term of this patent is extended or adjusted under 35 U.S.C. 154(b) by 0 days.

(21) Appl. No.: 14/621,876

(22) Filed: Feb. 13, 2015

(65) Prior Publication Data

US 2015/0237774 A1    Aug. 20, 2015

(30) Foreign Application Priority Data

Feb. 14, 2014   (HK) ................................ 14101452.3

(51) Int. Cl.
| | |
|---|---|
| *B32B 38/10* | (2006.01) |
| *H05K 13/04* | (2006.01) |
| *B23K 1/018* | (2006.01) |
| *H05K 3/22* | (2006.01) |
| *B23K 1/00* | (2006.01) |
| *B32B 43/00* | (2006.01) |

(52) U.S. Cl.
CPC ........... *H05K 13/0486* (2013.01); *B23K 1/018* (2013.01); *H05K 3/22* (2013.01); *B23K 2001/12* (2013.01); *B32B 38/10* (2013.01); *B32B 43/006* (2013.01); *H05K 2203/178* (2013.01); *Y10T 156/1153* (2015.01); *Y10T 156/1158* (2015.01); *Y10T 156/1168* (2015.01); *Y10T 156/1911* (2015.01); *Y10T 156/1917* (2015.01)

(58) Field of Classification Search
CPC .. B32B 38/10; B32B 43/006; Y10T 156/1153; Y10T 156/1158; Y10T 156/1168; Y10T 156/1911; Y10T 156/1917
USPC ........ 156/711, 712, 714, 752, 753, 922, 937
See application file for complete search history.

(56) References Cited

U.S. PATENT DOCUMENTS

| | | | | |
|---|---|---|---|---|
| 5,423,931 | A * | 6/1995 | Inoue ...................... | H01L 24/83 156/701 |
| 5,601,675 | A * | 2/1997 | Hoffmeyer .............. | H01L 24/32 156/750 |
| 5,715,592 | A * | 2/1998 | Mori .................. | H05K 13/0486 228/191 |
| 6,173,750 | B1 * | 1/2001 | Davis ................ | H01L 21/67144 156/707 |
| 2009/0242124 | A1* | 10/2009 | Konno .............. | H01L 21/67011 156/716 |
| 2011/0297329 | A1* | 12/2011 | Canale .............. | H01L 21/67092 156/756 |

* cited by examiner

*Primary Examiner* — Mark A Osele
*Assistant Examiner* — Nickolas Harm
(74) *Attorney, Agent, or Firm* — Renner Kenner Greive Bobak Taylor & Weber (57) ABSTRACT

A method for extracting components includes the steps of heating an electronic device having one or more components to a predetermined temperature so as to substantially weaken a bonding substance arranged to bond the one or more components to the electronic device, and thereafter manipulating the electronic device to extract the one or more components from the electronic device.

22 Claims, 6 Drawing Sheets

SYSTEM AND METHOD FOR EXTRACTING COMPONENTS

CROSS-REFERENCE TO RELATED APPLICATIONS

This application claims priority from Hong Kong Application No. 14101452.3 filed Feb. 14, 2014, the disclosure of which is incorporated herein by reference.

TECHNICAL FIELD

The present invention relates to a system and method for extracting components and particularly, although not exclusively to a system and method for extracting electronic components from an electronic device such as a printed circuit board.

BACKGROUND

Modern electronic devices such as computers, mobile phones and electronic control circuits contain various electronic components and circuitry which may be of specific value. Often when an electronic device such as a computer or Smartphone is no longer in operational condition, the electronic components used within the device may still be perfectly functional as certain electronic components can often outlast the life of the device itself.

As an example, certain electronic components such as central processing units (CPU), memory chips, programmable arrays, graphic processors, program counters or any other electronic components or integrated circuits may be considered more valuable than other components which are used in an electronic device. Accordingly, should an electronic device such as a control board of a smart phone or computer become redundant or partially damaged, it may well be that some of these electronic components on the control board of the device can be reused in other devices.

However, due to the manner in which these components are usually used in the manufacturing of an electronic device, it may be difficult to extract any individual components. In modern electronic devices, electronic components are usually bonded onto an electronic device, such as a control board, with the intention that the electronic component will not be removed from the board. This makes it difficult and costly to remove the components for reuse or recycling.

SUMMARY OF THE INVENTION

In accordance with a first aspect of the present invention, there is provided a method for extracting components comprising the steps of:
heating an electronic device having one or more components to a predetermined temperature so as to substantially weaken a bonding substance arranged to bond the one or more components to the electronic device; and
when upon the electronic device is heated to the predetermined temperature, manipulate the electronic device to extract the one or more components from the electronic device.

In an embodiment of the first aspect, the method further comprises a step of stacking the electronic device together to form a stack.

In an embodiment of the first aspect, the method further comprises a step of transferring the electronic device via an insulated channel after the device has been heated to a predetermined temperature location for extracting the one or more components from the electronic device.

In an embodiment of the first aspect, the step of extracting the one or more components from the electronic device further includes the steps of engaging the electronic device, and physically separating the one or more components from the electronic device.

In an embodiment of the first aspect, the step of physically separating the one or more components from the electronic device includes the use of an automated extraction arrangement arranged to pick up the one or more components from the electronic device.

In accordance with a second aspect of the present invention, there is provided a system for extracting components comprising:
 a preheating module arranged to heat an electronic device having one or more components to a predetermined temperature so as to substantially weaken a bonding substance arranged to bond the one or more components to the electronic device; and
 an extraction module arranged to manipulate the electronic device to extract the one or more components from the electronic device.

In an embodiment of the second aspect, the extraction module is arranged to manipulate the electronic device when the electronic device has been heated to the predetermined temperature.

In an embodiment of the second aspect, the system for extracting components further comprises a stacker module arranged to stack the electronic device together to form a stack.

In an embodiment of the second aspect, the stacker module is arranged to stack the electronic device together after the one or more components have been extracted from the electronic device.

In an embodiment of the second aspect, the system further comprises a conveyor arrangement arranged to transfer the electronic device from the preheating module to the extraction module.

In an embodiment of the second aspect, the conveyor arrangement is arranged to transfer the electronic device from the preheating module to the extraction module after the electronic device has been heated to the predetermined temperature.

In an embodiment of the second aspect, the conveyor arrangement includes an insulated channel arranged to minimize heat loss of the electronic device.

In an embodiment of the second aspect, the extraction module is arranged to engage the electronic device and physically separating the one or more components from the electronic device.

In an embodiment of the second aspect, the extraction module is further arranged to physically separating the one or more components from the electronic device by using an automated extraction arrangement arranged to pick up the one or more components from the electronic device.

In an embodiment of the second aspect, the preheating module is arranged to heat the electronic device at a temperature of between 150 degrees to 280 degrees Celsius.

In an embodiment of the second aspect, the automated extraction arrangement includes a robotic arm controlled by a computerized controller.

In an embodiment of the second aspect, the robotic arm comprises a head portion for releasably engaging with the at least one or more components of the electronic device.

In an embodiment of the second aspect, the computerized controller is arranged to control the robotic arm to extract one or more components from the electronic device by processing layout data associated with the electronic device.

In an embodiment of the second aspect, the layout data includes positions of the one or more components of the electronic device.

In an embodiment of the second aspect, the preheating module is an isothermal heating system.

In an embodiment of the first and second aspect, the electronic device is a printed circuit board.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1:
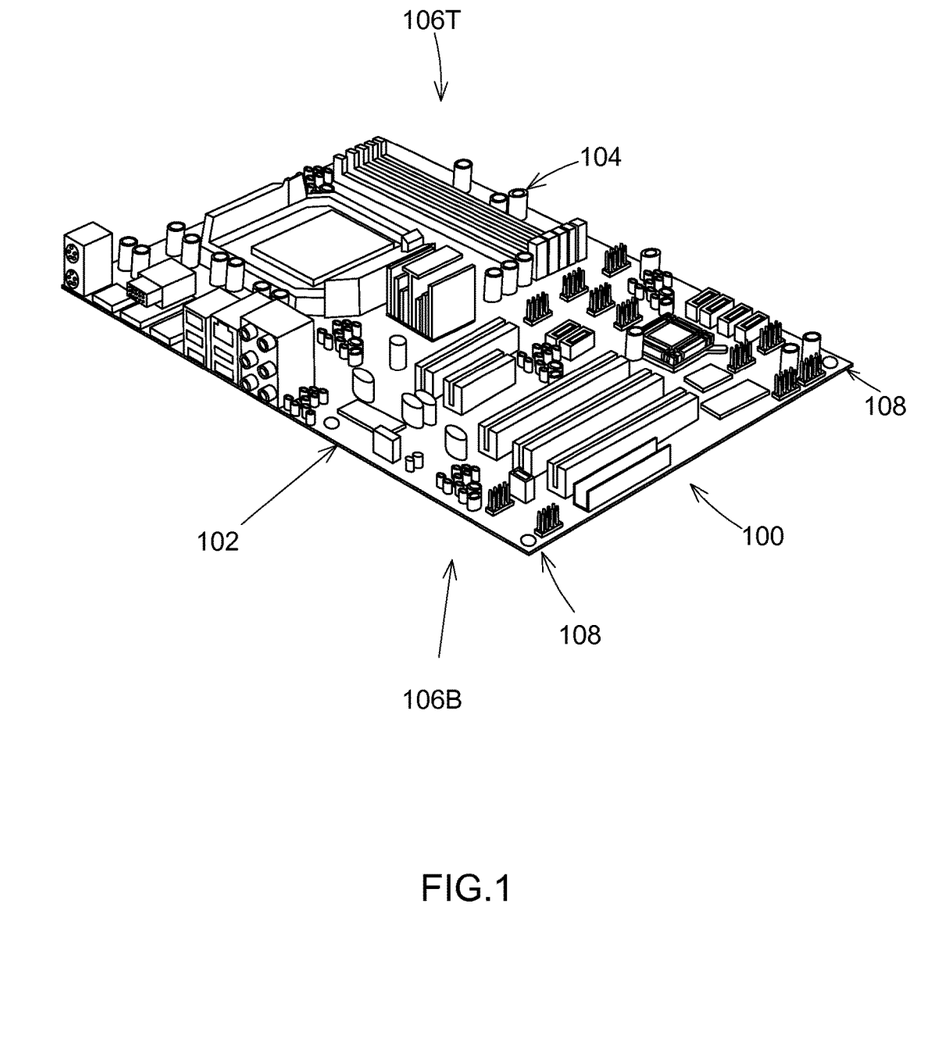
FIG. 1 is an illustration of an electronic device having one or more electronic components which may be processed by a system for extracting electronic components in accordance with one embodiment of the present invention.

With reference to FIG. 1, there is illustrated an embodiment of an electronic device 100 having one or more components 104 which may be suitable for extraction by a system for extracting components in accordance with one embodiment of the present invention. In this embodiment, the electronic device 100 is a printed circuit board (PCB) 102 which may have one or more components, such as electronic components 104 disposed thereon. These electronic components 104 may include integrated circuits, chips, transient components, resistors, motors, relays or any component which is arranged to provide a function under an electrical load, electrical signal or electronic signal. The term electronic component 104 may also include components which are non-electronic in nature but may operate with or incidental to an electrical or electronic device. This would include sockets, switches, fasteners, insulators, cables, chip engagement means, conductors, heat shields, heat-sinks, coolers or the like.

In this embodiment, the printed circuit board 100 is a computer mother board or main board which may be found in various computing devices. As shown in this example, the printed circuit board (PCB) may be a circuit board 102 which has various electronic components 104 bonded to conductive tracks to form electronic circuits. These electronic components 104 may include, without limitations:

Integrated Circuits (IC) which may sometimes be referred to as computer chips or chips and may include CPUs, memory, program counter, programmable arrays or graphical processors;

Electronic or electrical components such as capacitors, resisters, Light emitting diodes (LEDs), motors, and other electronic components; and Various other components such as sockets, hinges, springs, fasteners, battery holders, heat sinks, supporting plates or engagement members which can be used to engage with other electronic components.

These electronic components 104 may be disposed on the PCB 102 to perform a specific function when electricity or a signal is supplied to the components. As the electronic components 104 may be in contact with a conducting track on the PCB so as to allow electricity or signals to be communicated by each of the components, an adhesive, such as solder, may be used to bond the components 104 to the PCB 102.

As shown in this example embodiment, the printed circuit board 100 is substantially planar in shape and may include a top side of the printed circuit board 106T which faces upwards when the printed circuit board is in use and a bottom side 106B which may be mounted against a wall of a computer or device housing. The printed circuit board may also have one or more apertures 108 drilled into the printed circuit board surface so as to allow a fastener, such as a screw or a bolt, to be used to secure the board into a housing. As a person skilled in the art would appreciate, a PCB can be of various sizes or shape and may be used as a mother board, graphics card, sound card, control board or any other types of electronic devices.

Figure 2:
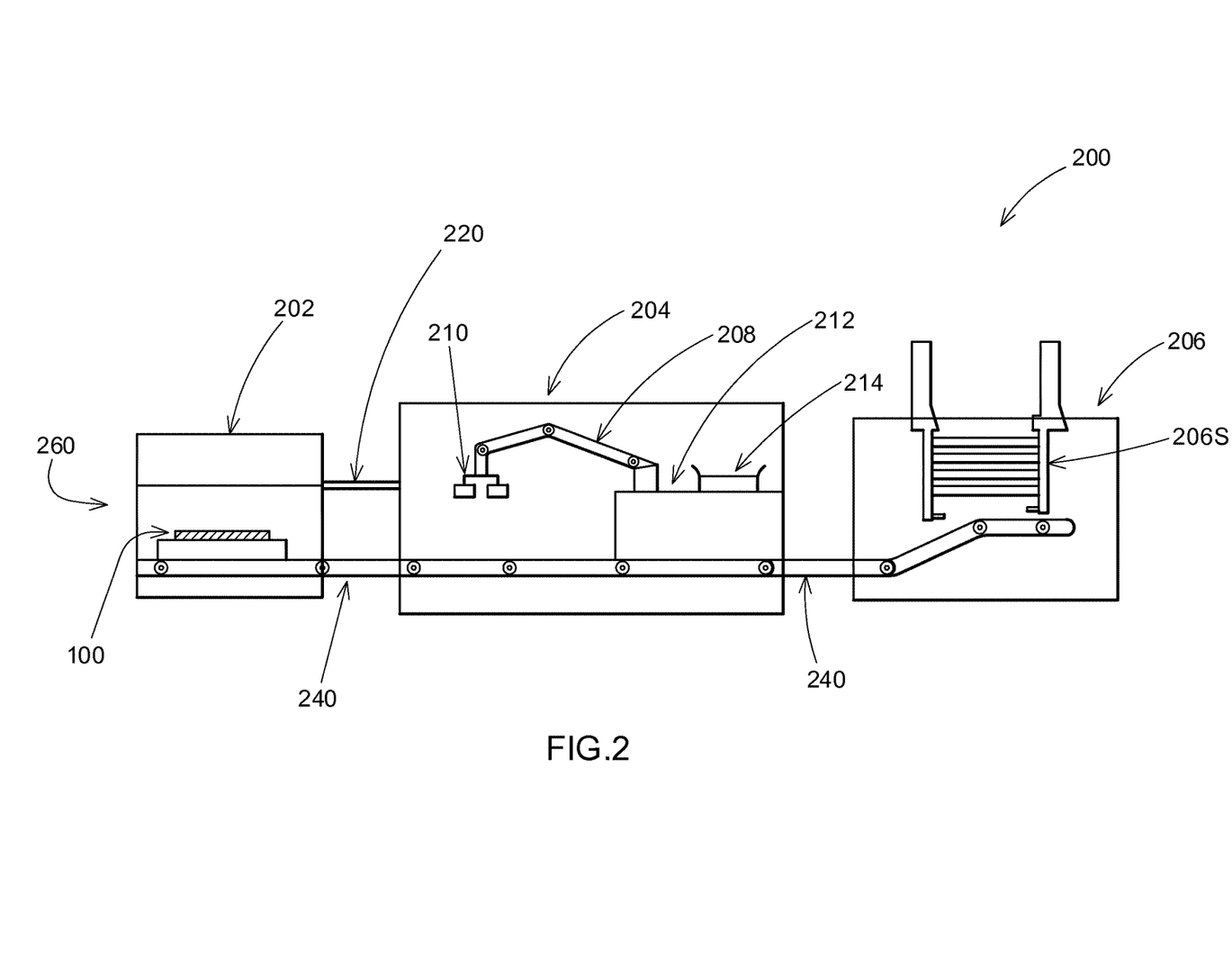
FIG. 2 is an illustration of an embodiment of a system for extracting components in accordance with one embodiment of the present invention.

With reference to FIG. 2, there is illustrated an embodiment of a system for extracting components 200 comprising: a preheating module 202 arranged to heat an electronic device having one or more components to a predetermined temperature so as to substantially weaken a bonding substance arranged to bond the one or more components to the electronic device; and an extraction module 204 arranged to manipulate the electronic device to extract the one or more components from the electronic device.

In this embodiment the system 200 includes a preheating module 202, an extraction module 204 and a stacker module 206 which are connected together by a conveyor system 240 arranged to deliver an electronic device 100 such as, but not limited to, a printed circuit board, for processing by each of the modules 202, 204, 206. In one embodiment, an electronic device such as a printed circuit board 100 is firstly delivered to an input 260 of the conveyor system 240 which is arranged to be feed the printed circuit board 100 into the preheating module 202. Whilst in the preheating module 202, the printed circuit board 100 is heated to a predetermined temperature.

Preferably, the printed circuit board 100 is heated to a temperature whereby the adhesives such as glue, mouldings or solder, used to bond the one or more components to the printed circuit board 100 are substantially softened or melted away such that the bonds between the components and the bonds between the components and the printed circuit board are substantially weaken. In certain examples of printed circuit boards which use a solder that includes a composition of lead, the preheating module 202 may heat the printed circuit board 100 to a predetermined temperature of approximately 180 to 200 degrees Celsius. However, where the printed circuit board is a ROHS (Restrictions of Hazardous Substance) compliant product which uses a substantially reduced lead or lead free solder, then the predetermined temperature may be increased to a approximately 220 degrees Celsius. In addition, in certain embodiments of the preheating module 202, the preheating module may also remove moisture from the air or on the electronic device to which it is heating as this would be advantageous in ensuring the electronic device undergoing preheating would be as dry as possible.

According to trials and experimentations by the inventors, a predetermined temperature and time utilized for heating each individual board is based on the properties of the solder which have been use to bond each of the components to the board. For solder which does not include any lead compounds a predetermined temperature of approximately 183 degrees is used to preheat the entire printed circuit board so as to substantially soften the solder. However, where the solder on the board will include a compound of lead based on percentage does not include a compound of lead based on the composition of the solder, the preheating temperature may be increased to approximately 200-220 degree Celsius. Experimental results have shown that at these temperatures the solder is able to substantially weaken for most printed circuit boards including those that are commonly recycled such as mother boards and graphics cards regularly used in mainstream computing and tablet devices.

Once the printed circuit board 100 is heated to the predetermined temperature such that the adhesive material used to bond the components onto the board has been substantially soften or weaken, the printed circuit board 100 is then delivered by the conveyor system 240 to the extraction module 204. Preferably as shown in FIG. 2, there is a cover arranged to substantially surround the conveyor system 240 between the preheating module 202 and the extraction module 204 so as to minimize heat loss. In some embodiments, the cover operates as an insulation shield 220 or housing between the preheating module 202 and the extraction module 204 such that the printed circuit board 100 is insulated as it is transported from the preheating module 202 to the extraction module 204. By providing an insulation shield 220 between the preheating module 202 and the extraction module 204, heat loss experienced by the printed circuit board 100 after it leaves the preheating module 202 is substantially reduced. This is advantageous in that the insulation shield 220 limits the cooling of the solder which will in turn maintain the softness and weakness of the adhesive properties on the components of the printed circuit board 100.

Once the printed circuit board 100 reaches the extraction module 204, the extraction module 204 proceeds to extract one or more components from the printed circuit board 100. In one embodiment, the extraction module firstly uses a lock or engaging mechanism to engage the printed circuit board 100 into a position such that the board can be physically manipulated without a shifting from a predefined position. Once the printed circuit board 100 is in position and is securely engaged, the extraction module 204 uses an extraction arrangement 212 to extract the desired component or components from the printed circuit board 100. Preferably, the extraction arrangement 212 has an electronically controlled extraction arm 208 arranged to manipulate the board in a manner that would extract the individual component disposed on the board 100.

Preferably, the arm 208 includes a robotic hand 210 or piles which is arranged to clamp on each of the one or more components which are intended to be removed and a physical force is then applied to lift and separate the component from the printed circuit board 100 itself. Alternatively, the arm 208 may have a pneumatic system which provides a suction force to lift the one or more components from the printed circuit board 100.

In this embodiment, the extraction arrangement 204 is controlled by a microprocessor controller 212C which has been provided with layout data of the printed circuit board. The layout data, which may be in the form of a layout scheme or blueprints of the printed circuit board 100 or any part of an electronic device undergoing processing by the extraction module 204 may be arranged to outline the dimension of the printed circuit board as well as the location of specific components such as integrated circuits, CPU, Graphic processors, memory chips or other components on the printed circuit board to the microprocessor of the controller. By utilizing this information, the microprocessor or computer controller 212C can then manipulate the robotic arm 208 to a desired position of a specific component and in turn, use the clamp or pneumatic arrangement to extract this component from the printed circuit board. As the printed circuit board 100 has been preheated to a predetermined temperature, the adhesive such as solder which is used to bond the component to the printed circuit board would already have been soften and thus allowing the individual component to be removed. Once the components are removed the components are then disposed in separate collection areas 214 which are subsequently removed for storage or further processing.

The microprocessor or computerized controller 212C may be programmed or otherwise instructed by input 222 to only remove certain components from the printed circuit board or electronic device. This is because only certain components on the printed circuit board may be of value, in which case it would only be desirable to remove those components so as to improve the speed and efficiency of the extraction process. In one embodiment, once the layout data of the electronic device is inputted 222 into the controller, the user may selectively choose which of the components should be extracted.

Once the printed circuit board 100 has been processed by the extraction module 204 and the desired components disposed on the printed circuit board 100 have been removed by the extraction module 204, certain components, particularly those of limited or little value, may still remain on the printed circuit board 100. As a person skilled in the art would appreciate, the extraction module 204 will be capable of removing one or all electronic components on the printed circuit board, but a desired number or specific component may also be removed for cost reasons. Once the extraction process has been completed by the extraction module 204 the printed circuit board 100 is displaced by the conveyor system 240 and transferred to a stacker module 206 whereby each individual board is physically lifted and stacked together to form a stack 206S. In this way, the printed circuit boards 100 can be removed in bulk to storage or recycling.

Figure 3:
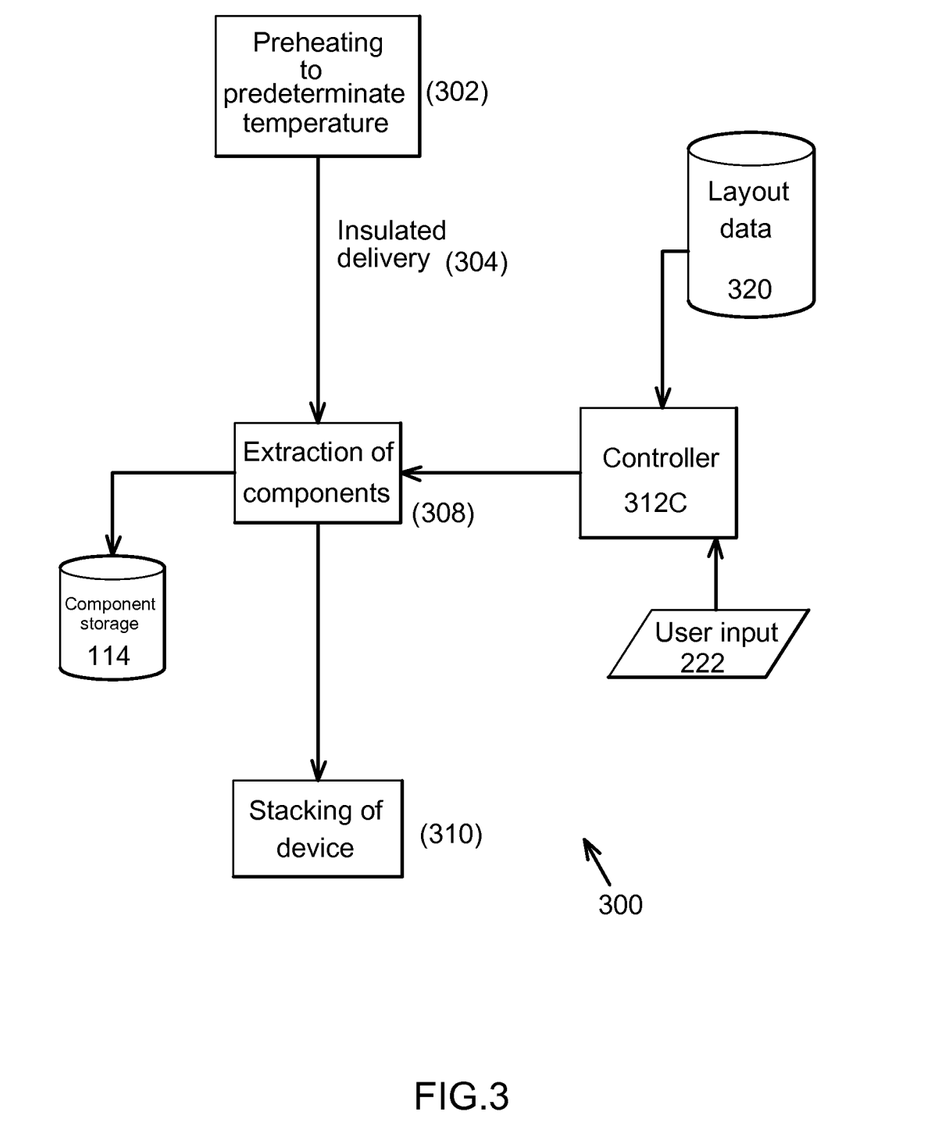
FIG. 3 is a flow diagram of a method for extracting components as performed by the system of FIG. 2.

With reference to FIG. 3 there is illustrated a flow diagram of the individual processes of a method for extracting components 300. In this embodiment, an electronic device such as the printed circuit board 100 is firstly preheated to a predetermined temperature with a preheating module (302) and as discussed with reference to FIG. 2. Preferably, this may be a temperature capable of softening or weakening the solder which is then used to bond individual electronic components to a printed circuit board or other forms of electronic device. Once the preheating process is completed, the printed circuit board 100 is then delivered (304) though an insulated delivery system such as a conveyor belt which has an insulation housing arranged to substantially surround the conveyor belt connecting the preheating module 202 and the extraction module 204 as described with reference to FIG. 2.

In this example, the extraction module 204 is controlled by an electronic controller 212C which is able to access the layout data 320 or schematic blueprints of the individual electronic device or a printed circuit board such that the location of specific components can be identified and removed by a robotic or mechanical arm, clamp or other forms of physical means such as by a vacuum/pneumatic system as described with reference to FIG. 2 (308). Once the desired or targeted electronic components are removed and extracted for storage, the printed circuit board 100 is then transported by the conveyor system 240 to a stacker module 206 where the boards are stacked together for further processing or storage (310).

Figure 4:
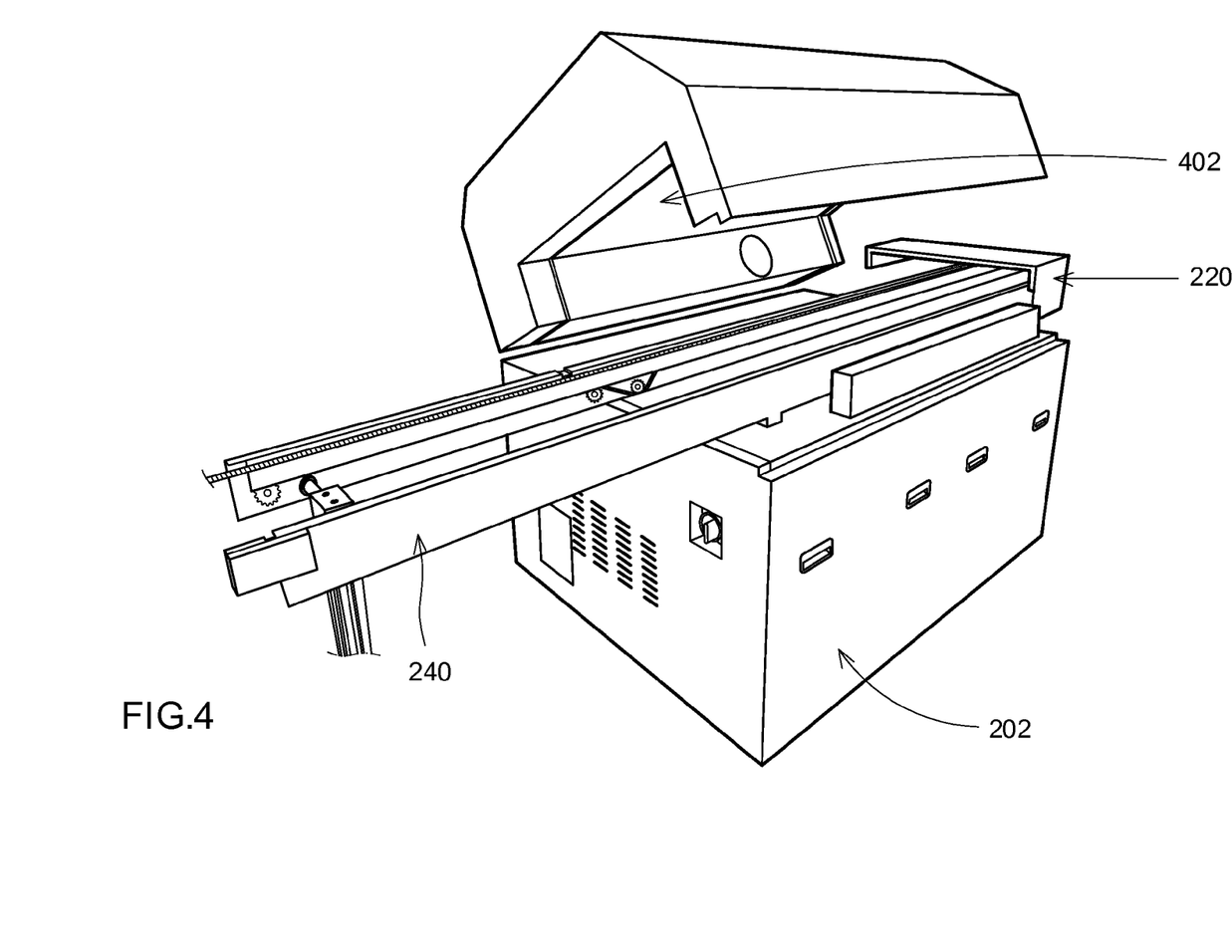
FIG. 4 is an embodiment of their preheating module of a system for extracting components of FIG. 2.

As shown with reference to FIG. 4, there is illustrated an example of a preheating module 202. In this example embodiment, the preheating module 202 includes a heating element 402 which may be a fan force gas heating element, a fan force electric heating element or a gas fire or any other form of heating element where the temperature of a heating chamber of the preheating module 202 can be adequately controlled for a duration of time. Preferably the preheating module 204 is arranged to be fully controlled and partially or substantially insulated such that a precise temperature can be controlled for a duration so as to provide an isothermal heating system. This is advantageous in that the correct temperature is achieved and thus the solder or any other type of bonding adhesives which are used in the printed circuit board can be softened or weakened whilst the remaining components on the printed circuit board will remain undamaged. In turn, high value integrated circuits which may ultimately be reused when extracted can avoid being damaged during the preheating process if the preheating is properly controlled.

Figure 5:
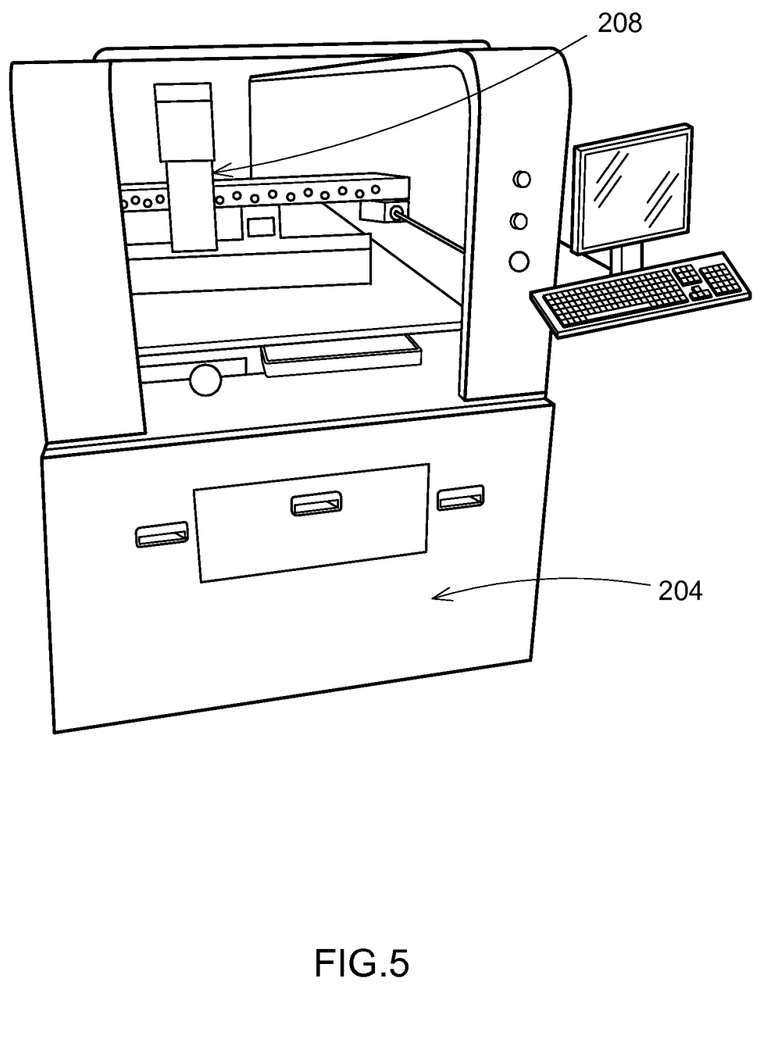
FIG. 5 is an illustration of the extraction module of the system for extracting components of FIG. 2.

With reference to FIG. 5, there is illustrated an embodiment of an extraction module 204. In this embodiment the extraction module 204 includes an extraction arm 208 which is electronically controlled by a computer or controller which is arranged to process the layout data for the particular electronic device or printed circuit board which is currently undergoing extraction process. The extraction arm 208 may be a robotic arm arranged to move about the printed circuit board by use of a number of servos which are in turn controlled by the microprocessor. Various sensors may also be disposed within the extraction module so as to signal to the microprocessor the position of the robotic arm or printed circuit board undergoing the extraction process.

Preferably, the robotic arm 208 is arranged to grasp on to an integrated circuit or other component and physically remove the component by lifting the component from the printed circuit board underneath. Alternatively, the arm may have a vacuum tube system whereby a robotic or mechanic arm having a vacuum tube can be used to apply a suction force so as to pick up and remove a component or electronic component from the printed circuit board itself. In one example, the extraction module operates in a similar manner as a surface mount technology component replacement system or commonly known as a pick and place machine arranged to placed electronic components onto a printed circuit board but in reverse whereby instead of the electronic component being placed on the board the components are removed from the board itself.

In one embodiment of the extraction module 204, the module 204 further includes one or more heating elements arranged to heat the electronic device within the extraction module 204 whilst it is undergoing component extraction. Preferably, the heating elements maintain the predetermined temperature so as to ensure the solder or other forms of adhesives used to bond the components to the electronic device remains in a soft or weaken state.

Figure 6:
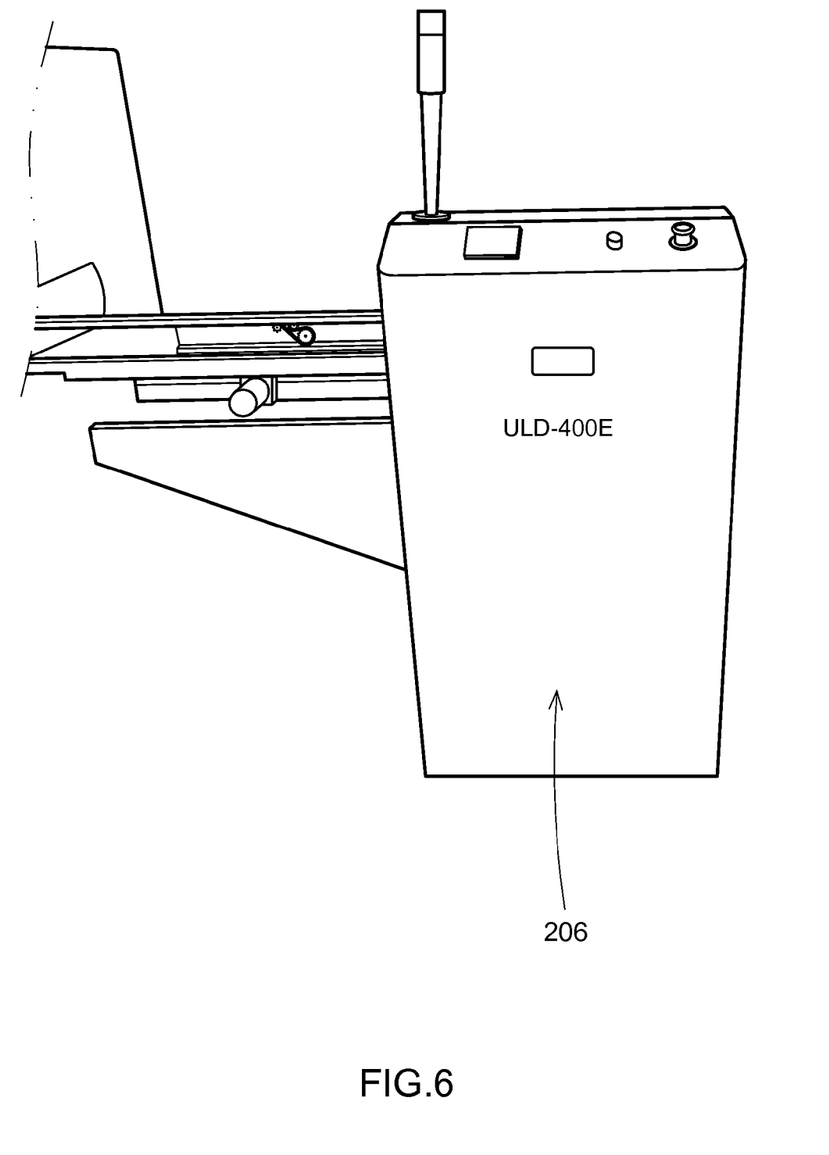
FIG. 6 is a stacker module of the system as illustrated in FIG. 2.

With reference to FIG. 6 there is illustrated a stacker module 206 which is arranged to receive a printed circuit board that has been processed by the extraction module 204.

Once a printed circuit board is to reach a stacker module a majority of the electronic components particularly important components which are to be extracted as already being removed and thus in this example the printed circuit board 100 should be substantially planar although this may not be the case particularly where the printed circuit board 100 may still a number of sockets and various other components disposed thereon. In this example, the stacker module 206 is arranged to physically transport each of the individual printed circuit boards 100 form the conveyor system 240 and form a stack of printed circuit boards 100 and thus allowing the stack of printed circuit boards 100 to be collated and removed or otherwise transported to a separate location for storage or further processing.

Preferably, the stacker module 206 includes a plurality of lifting flaps which elevates each printed circuit board or electronic device as it arrives to the stacker module 206. Once lifted, the printed circuit board is elevated to a new slot position and thus allowing a following printed circuit board or electronic device to be lifted to a slot position below the preceding printed circuit board. In turn, a stack of printed circuit boards are formed, allowing for easy storage.

In an alternative embodiment, the insulation shield 220 may itself include a heater element 202 to maintain or boost the heat of the electronic device as it is transferred by the conveyor system 240 from the preheating module 202 to the extraction module 204.

Although the electronic device described in the examples above relates to printed circuit boards, the term electronic device will include other devices. It may be that whole electronic devices in any shape or configuration, or even mechanical devices in any shape or configuration can be processed by the system 200 to extract one or more components.

It will also be appreciated that where the methods and systems of the present invention are either wholly implemented by computing system or partly implemented by computing systems then any appropriate computing system architecture may be utilised. This will include stand alone computers, network computers and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A system for extracting one or more components from an electronic device, the system comprising:
   a preheating module arranged to heat an electronic device with one or more components bounded thereto by a bonding substance to a predetermined temperature so as to substantially weaken the bonding substance
   a computerized controller arranged to receive layout data of the electronic device and information associated with at least one selected components to be removed from the electronic device;
   an extraction module comprising:
      an engagement mechanism arranged to engage the electronic device; and a robotic arm operably connected with and controlled by the computerized controller to automatically extract the at least one selected components from the heated electronic device based on the layout data and the information; and a conveyor system arranged to transfer the heated electronic device in single pass from the preheating module to the extraction module.

2. The system in accordance with claim 1, wherein the extraction module is arranged to extract the at least one selected components when the electronic device is at the predetermined temperature.

3. The system in accordance with claim 1, further comprising a stacker module arranged to receive the electronic device after extraction, the stacker module being operable to stack a plurality of electronic devices together; wherein the conveyor system is arranged to transfer the electronic device after extraction, in single pass, from the extraction module to the stacker module.

4. The system in accordance with claim 1, wherein the preheating module is arranged to heat the electronic device at a temperature of between 150 degrees to 280 degrees Celsius.

5. The system in accordance with claim 1, wherein the robotic arm is operable to releasably engage with at least one of the one or more components of the electronic device.

6. The system in accordance with claim 1, wherein the layout data includes information related to positions of the one or more components of the electronic device.

7. The system in accordance with claim 1, wherein the preheating module is an isothermal heating system.

8. The system in accordance with claim 1, wherein the extraction module further includes a heating element arranged to heat the electronic device during extraction.

9. The system in accordance with claim 1, wherein the electronic device is a printed circuit board.

10. The system for extracting one or more components from an electronic device in accordance with claim 1, wherein the conveyor system is an insulated delivery system arranged to minimize heat loss of the electronic device.

11. The system for extracting one or more components from an electronic device in accordance with claim 1, wherein the conveyor system comprises a conveyor belt.

12. The system for extracting one or more components from an electronic device in accordance with claim 1, further comprising a collector arranged to collect the at least one extracted component, and wherein the robotic arm is arranged to transfer the at least one extracted component to the collector.

13. The system for extracting one or more components from an electronic device in accordance with claim 1, wherein the computerized controller is preprogrammed with the information associated with at least one selected components to be removed from the electronic device.

14. The system for extracting one or more components from an electronic device in accordance with claim 1, wherein the computerized controller is arranged to receive a user input containing information associated with at least one selected components to be removed from the electronic device.

15. The system in for extracting one or more components from an electronic device in accordance with claim 1, wherein the preheating module comprises at least one of a fan force gas heating element, a fan force electric heating element, and a gas fire heating element.

16. The system for extracting one or more components from an electronic device in accordance with claim 1, wherein the bonding substance comprises at least one of solder and adhesives.

17. The system for extracting one or more components from an electronic device in accordance with claim 1, further comprising an insulation shield arranged between the preheating module and the extraction module.

18. The system for extracting one or more components from an electronic device in accordance with claim 17, wherein the insulation shield comprises a heater element.

19. A method for extracting one or more components from an electronic device, comprising the steps of:

heating, using a preheating module, an electronic device with one or more components bounded thereto by a bonding substance to a predetermined temperature so as to substantially weaken the bonding substance;

receiving, at a computerized controller, layout data of the electronic device and information associated with at least one selected components to be removed from the electronic device;

transferring, in single pass using a conveyor system, the heated electronic device from the preheating module to an extraction module;

engaging, using an engagement mechanism of the extraction module, the electronic device;

automatically extracting, using a robotic arm operably connected with and controlled by the computerized controller, the at least one selected components from the heated electronic device based on the layout data and the information.

20. The method for extracting one or more components from an electronic device in accordance with claim 19, further comprising the steps of:

transferring, in single pass using the conveyor system, the electronic device after extraction from the extraction module to a stacker module; and receiving, at the stacker module, the electronic device after extraction;

wherein the stacker module is operable to stack a plurality of electronic devices together.

21. The method for extracting one or more components from an electronic device in accordance with claim 19, wherein the predetermined temperature is between 150 degrees to 280 degrees Celsius.

22. The method for extracting one or more components from an electronic device in accordance with claim 19, wherein the electronic device is a printed circuit board and the bonding substance comprises at least one of solder and adhesives.

* * * * *